United States Patent
Strachan et al.

(10) Patent No.: US 8,212,621 B2
(45) Date of Patent: Jul. 3, 2012

(54) MEMRISTIVE PROGRAMMABLE FREQUENCY SOURCE AND METHOD

(75) Inventors: John Paul Strachan, Millbrae, CA (US); Philip J Kuekes, Menlo Park, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 105 days.

(21) Appl. No.: 12/916,485

(22) Filed: Oct. 29, 2010

(65) Prior Publication Data

US 2012/0105159 A1    May 3, 2012

(51) Int. Cl.
*H03L 7/00*    (2006.01)
(52) U.S. Cl. ..... 331/2; 331/108 R; 331/115; 331/116 R; 331/116 M; 257/4
(58) Field of Classification Search ............... 331/2, 115, 331/107 R, 116 M, 116 R, 154; 257/4, 14, 257/536
See application file for complete search history.

(56) References Cited

U.S. PATENT DOCUMENTS 7,443,711 B1    10/2008    Stewart et al.

OTHER PUBLICATIONS

M. Itoh et al., "Memristor Oscillators," International Journal of Bifurcation and Chaos, vol. 18, No. 11, 2008, pp. 3183-3206.
B. Muthuswamy, "Memristor Based Chaotic Circuits," IETE Tech. Rev., vol. 26, No. 6, Nov.-Dec. 2009, pp. 1-16.
Y. Pershin et al., "Practical approach to programmable analog circuits with memristors," IEEE Transactions on Circuits and Systems I: Regular Papers, vol. 57, No. 8, Aug. 2010, pp. 1857-1864.
W. Sun et al., "A Memristor based chaotic oscillator," International Conference on Communications, Circuits and Systems, 2009, Jul. 2009, pp. 955-957.

*Primary Examiner* — Joseph Chang
*Assistant Examiner* — Jeffrey Shin (57) ABSTRACT

A frequency source and a method of frequency generation employ a memristive negative differential resistance (M-NDR) voltage controlled oscillator (VCO). The frequency source includes a first M-NDR VCO of a plurality of memristive VCOs to provide a first signal having a first signal frequency. The frequency source further includes a second M-NDR VCO of the plurality to provide a second signal having a second signal frequency. The first and second M-NDR VCOs are interconnected with the plurality of memristive VCOs. The first and second M-NDR VCOs have independent programmable states and are connected to a common output of the frequency source. The method includes providing an M-NDR VCOs, where each M-NDR VCO includes an M-NDR device connected in parallel with a capacitance, and applying a bias voltage to activate a selected M-NDR VCO of the plurality to produce a frequency output.

20 Claims, 4 Drawing Sheets

MEMRISTIVE PROGRAMMABLE FREQUENCY SOURCE AND METHOD

CROSS-REFERENCE TO RELATED APPLICATIONS

N/A

STATEMENT REGARDING FEDERALLY SPONSORED RESEARCH OR DEVELOPMENT

N/A

BACKGROUND

A frequency source is a device or system that provides a signal comprising one or more frequencies. For example, a radio frequency (RF)/microwave frequency source may be used to provide a signal at a frequency in the RF/microwave frequency range. In some examples, frequency sources provide a single, fixed frequency signal. However, such fixed frequency signals may have limited utility. A more general frequency source may provide multiple frequencies. The multiple frequencies may be either provided simultaneously as in the case of a noise source or a comb generator or in a selected manner according to a control or programming input of the frequency source.

In particular, frequency sources may be designed to provide one or more of a plurality of frequencies, according to a predetermined programming. Such programmable frequency sources have a wide variety of uses and may be either programmed at a factory prior to use or field programmable. Examples of programmable frequency sources include those employing diodes or transistors as an active element to generate an oscillation that produces a desired frequency in the output signal.

Programming in a programmable frequency source may be provided by an adjustable component (e.g., an adjustable resistor or capacitor), in some examples. However, adjustable components may severely limit the programmability of a frequency source. For example, in many case the adjustable component may only be adjustable during manufacture. In other examples, an external control circuit or system such as a computer controller provides programming. The external control circuit or system may facilitate field programmability. Unfortunately, such external control circuits/systems generally may increase the cost, complexity and overall size of the programmable frequency source while simultaneously decreasing reliability and durability.

BRIEF DESCRIPTION OF THE DRAWINGS

The various features of examples may be more readily understood with reference to the following detailed description taken in conjunction with the accompanying drawings, which illustrate examples in accordance with the principles described herein, where like reference numerals designate like structural elements, and in which.

Certain examples have other features that are one of in addition to and in lieu of the features illustrated in the above-referenced figures. These and other features are detailed below with reference to the preceding drawings.

DETAILED DESCRIPTION

Examples provide a memristor-based programmable frequency source. In particular, the memristor-based programmable frequency source is state programmable to provide a selected frequency or a set of frequencies from a set of predetermined frequencies, according to various examples. Both state programmability and frequency generation are provided by and use memristors of memristive voltage controlled oscillators (VCOs). That is, memristors of the memristive VCOs participate both in the actual production of the frequencies output by the memristor-based programmable frequency source and in determining which frequencies are to be produced according to the state programming. Since the memristors are integral to the memristive VCOs, state programming is both reprogrammable and substantially non-volatile between programming operations. Moreover, state programming largely obviates a need for circuitry outside of elements of the memristive VCOs themselves, such that component count and increasing reliability of the memristor-based programmable frequency source may be greatly reduced.

According to various examples, individual memristive VCOs of a plurality may be programmed to be either in an ON state or an OFF state to provide state programmability. In the ON state, the individual memristive VCO produces an output signal at a predetermined frequency. In the OFF state, the memristive VCO produces no output signal. Any or all of the predetermined frequencies of the memristor-based programmable frequency source may be activated or inactivated (i.e., turned on or off), according to the programming. Hence, the memristor-based state programmable frequency source may be used to produce a selected one or more of the predetermined frequencies.

A memristor, as defined herein, is a two-terminal electrical device that may function as a passive current limiter in which an instantaneous resistance state is a function of bias history. Specifically, an electrical flux or a time integral of the electric field, between terminals of the memristor is a function of the amount of electric charge, or a time integral of a current, that has passed through the memristor. As such, a memristor represents a two-terminal device that effectively has a memory of its 'state' (e.g. resistance) that is a function of its bias history. Moreover, the bias history is solely dependent on the amount of electric charge that has passed through the device. In other words, memristor resistance may be changed by applying a programming signal to the memristor (e.g., by applying a voltage across the two terminals and passing a current through the memristor), for example.

Notably, memristors may be switched between 'states' (e.g., using the programming signal) and therefore are potentially useful as programmable circuit elements for a variety of memory circuits and related applications. Moreover, the programmed state of the memristor is maintained without power such that memristors may function as inherently non-volatile memory elements. For example, a memristor may be switched by a programming signal between an 'ON' state and an 'OFF' state effectively implementing a binary memory cell or element. In another application, the memristor may be switched or programmed to assume any one of several intermediate states between the ON state and the OFF state using the programming signal. Moreover, the memristor may be used to record and retain an analog level as opposed to a binary (ON/OFF) level facilitating its use in circuits such as neural networks.

Figure 1:
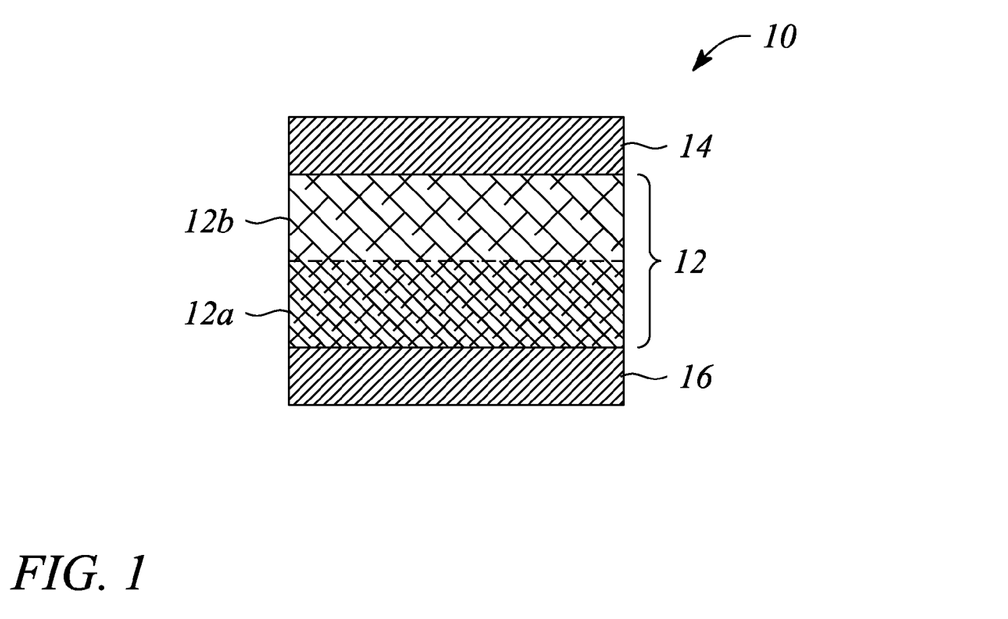
FIG. 1 illustrates a simplified cross sectional view of a memristor, according to an example.

FIG. 1 illustrates a simplified cross sectional view of a memristor 10, according to an example of the principles described herein. The memristor 10, as illustrated, is a two terminal device comprising a layer 12 of memristor material. A memristor material is a material that exhibits a memristor phenomenon or characteristic when subjected to a voltage. The memristor 10 is disposed between a first or 'top' electrode 14 and a second or 'bottom' electrode 16. The first and second electrodes 14, 16 facilitate applying a programming signal (e.g., a programming voltage) to affect a change in the memristor material layer 12. The change in the memristor material layer 12 produced by the programming signal may be understood in terms of oxygen migration within the memristor material layer 12, according to some examples. For example, a boundary between a layer of memristor material 12b that is deficient in oxygen and another effectively 'normal' memristor material layer 12a (i.e., oxide that is not oxygen deficient) may move as a result of exposure to the programming signal. The movement of the boundary may result from oxygen migration under the influence of the programming signal, for example. A final location of the movable boundary may establish the 'programmed' resistance of the memristor 10, for example.

In some examples, the memristor material layer 12 is a thin film layer having a thickness on the order of several tens of nanometers. For example, the memristor material layer 12 may have a thickness between about 10 nanometers (nm) to about 100 nm. In another example, the thin film memristor material layer 12 may be between about 20 nanometers (nm) and about 50 nm thick.

In various examples, the memristor material layer 12 of the memristor 10 may be substantially any oxide that can be formed into a layer between a pair of electrodes. For example, titanium oxide ($TiO_2$) may be used as the oxide layer in a memristor. Other oxides that may be employed include, but are not limited to, nickel oxide, nickel oxide doped with chromium, strontium titanium oxide, strontium titanium oxide doped with chromium, and tungsten oxide.

In some examples, the oxide layer 12 may comprise a crystalline oxide. In some of these examples, the crystalline oxide may be mono-crystalline. In other examples, the oxide layer 12 comprises an amorphous oxide. In yet other examples, the oxide layer comprises either a nanocrystalline oxide or a microcrystalline oxide. A nanocrystalline oxide is an oxide that includes or comprises a plurality of nano-scale crystallites while a microcrystalline oxide may include crystallites having sizes in the micron range, for example. In some examples, the oxide layer may comprise a plurality of layers. A first layer of the plurality may be a normal oxide (e.g., $TiO_2$) while a second layer may be an oxygen depleted or oxygen deficient oxide layer (e.g., $TiO_{2-x}$ where '2-x' denotes an oxygen deficit, and where x is greater than 0 and less than about 2). For example, the oxygen deficient $TiO_{2-x}$ may have values of x that are greater than about $10^{-5}$ and less than about $10^{-2}$. In another example, the oxygen deficient $TiO_{2-x}$ may have a value of x that ranges up to about 1.0.

An oxygen deficient oxide layer may be produced by exposing a surface of the oxide layer (e.g., $TiO_2$) to a gas mixture of 95% nitrogen ($N_2$) and 5% hydrogen ($H_2$) at a temperature of about 550 degrees Centigrade (° C.) for about 2 hours, for example. The gas mixture effectively removes oxygen from the oxide layer leaving the oxygen deficient oxide layer in a portion of the oxide layer near the surface. The oxygen deficient layer may have 'oxygen vacancies' that may act as n-type dopants within the oxide layer. The presence of these oxygen vacancies may allow the oxide layer to function as an electron donor doped semiconductor, for example.

The first and second electrodes 14, 16 comprise a conductor. For example, the first electrode 14 and the second electrode 16 may comprise a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first and second electrodes 14, 16.

Additionally, the first and second electrodes 14, 16 may comprise more than one layer. For example, a layer of Ti may be employed between a Pt-based electrode and a $TiO_2$ oxide layer 12. The Ti layer may assist in providing an oxygen deficient layer (i.e., $TiO_{2-x}$) in the oxide layer 12, for example. In still other examples, materials used in the electrodes 14, 16 may act as a diffusion barrier. For example, titanium nitride (TiN) may be employed as a diffusion barrier.

In some examples, a conductive material of one or both of the first and second electrodes 14, 16 may comprise a metallic form of a metal-oxide used as the oxide layer 12. For example, a Ti electrode 14, 16 may be employed when the oxide layer 12 comprises $TiO_2$. Similarly, one or both of the electrodes 14, 16 may comprise Ta when the oxide layer 12 comprises $Ta_2O_5$. In yet other examples, a refractory material such as tungsten may be used for situations in which the electrode(s) 14, 16 may be exposed to very high temperatures (e.g., during manufacturing), for example.

In addition to providing state programmability, memristors, or more generally memristive devices, may exhibit negative differential resistance (NDR). The presence of NDR in a memristive device facilitates the use of such memristive devices in realizing oscillator circuits. In particular, a memristive NDR (M-NDR) device may oscillate when connected to a suitable means for energy storage such as, but not limited to, a capacitance, and biased appropriately. Moreover, since the resultant oscillation is generally a function of both the programmed state (i.e., programmed resistance of the memristor) and a bias voltage, such oscillators that employ the NDR of a memristive device are more properly termed voltage controlled oscillators (VCOs).

Negative differential resistance (NDR) is defined herein as a negative voltage-current relationship in a device. In particular, NDR is characterized by an increase in current flowing through a device as voltage across the device is decreased. In contrast, a non-NDR device such as an 'ohmic' or conventional resistive device exhibit a positive voltage-current relationship, by definition herein. Namely, as the voltage across the device increases, current flowing through the device also increases. Memristors and related memristive devices may exhibit NDR at certain bias voltage levels when operated near certain temperature points that are dependent on a material of the memristive device. For example, cooling a titanium oxide ($Ti_xO_y$) based memristor to below about 155 Kelvins (K) (e.g., by immersing the memristor in liquid helium) may produce NDR in a portion of a voltage-current relationship of the memristor. By selecting a bias voltage that corresponds to the NDR portion of the voltage-current relationship of such an appropriately cooled memristor, the memristor may be operated as a memristive NDR (M-NDR) device, for example. Other materials may exhibit NDR at room temperature, or higher (e.g., the "certain temperature points" are at or near room temperature).

The presence of observed NDR in memristive devices may be understood as being due to a Joule heating induced metal-insulator transition (MIT) within a portion or layer of the memristor material or matrix of the memristive device. In particular, a portion of the memristive material in a memristive device undergoes MIT when exposed to a current flowing through the device. Additional information regarding M-NDR devices and their application to VCOs is provided in co-pending application to Pickett et al., U.S. Ser. No. 12/837,903, incorporated herein by reference in its entirety.

Figure 2:
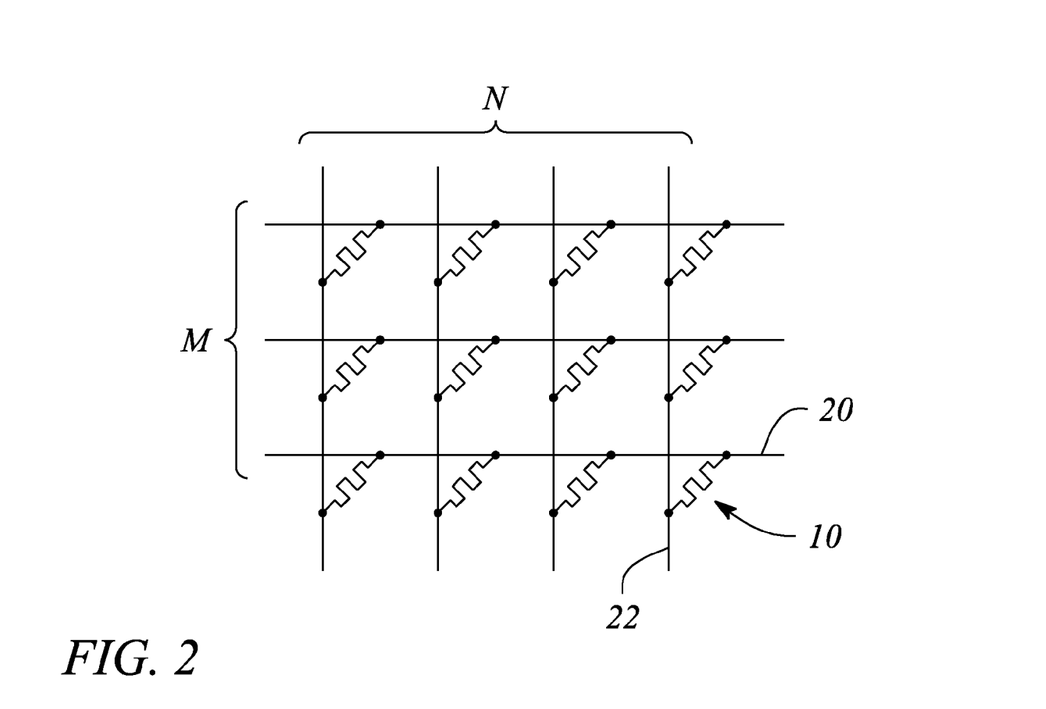
FIG. 2 illustrates a schematic diagram of a memristor-based circuit arranged as an M×N crossbar array, according to an example.

FIG. 2 illustrates a schematic diagram of a memristor-based circuit arranged as an M×N crossbar array, according to an example of the principles described herein. In particular, the memristor-based circuit illustrated in FIG. 2 comprises M rows of memristors 10 connected together with a common conductor referred to as a 'bit line' 20. Another bit line 22 connects columns of memristors 10. As such, a 1×N crossbar array would have one row and N columns and similarly N memristors 10. Parallel bit lines 20, 22 may be implemented as parallel conductor traces, conductor 'bars' or 'wire electrodes', for example. The material of the wire electrodes may form the electrodes 14, 16 of the memristors 10, for example. Further, the individual memristors 10 may be formed between the wire electrodes at cross points between the wire electrodes according to some examples.

By definition herein, a 'cross point' is a point at which two wires cross over or under one another. For example, a cross point of wire electrodes in a crossbar array is a point where a wire electrode of a first layer crosses under a wire electrode of another (e.g., overlying) layer. A cross point between wire electrodes is generally created by two wire electrodes that have different orientations. For example, a pair of wire electrodes that are oriented substantially perpendicular or orthogonal to one another may cross over one another at some point along their respective lengths. The point at which the wire electrodes cross is the 'cross point'. Importantly however, while a cross point necessarily involves wires crossing one another, the wires may not actually contact one another at the cross point. For example, while a crossbar array comprises a plurality of wire electrode cross points, the wire electrodes in a first layer are generally spaced apart from wire electrodes in a second layer of the crossbar array by a memristive layer or a plurality of memristors in between the two wires (e.g., spaced by a memristor at the cross points).

Further, as used herein, the article 'a' is intended to have its ordinary meaning in the patent arts, namely 'one or more'. For example, 'a memristor' means one or more memristors and as such, 'the memristor' explicitly means 'the memristor(s)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means plus or minus 10% unless otherwise expressly specified. Moreover, examples herein are intended to be illustrative only and are presented for discussion purposes and not by way of limitation.

Figure 3A:
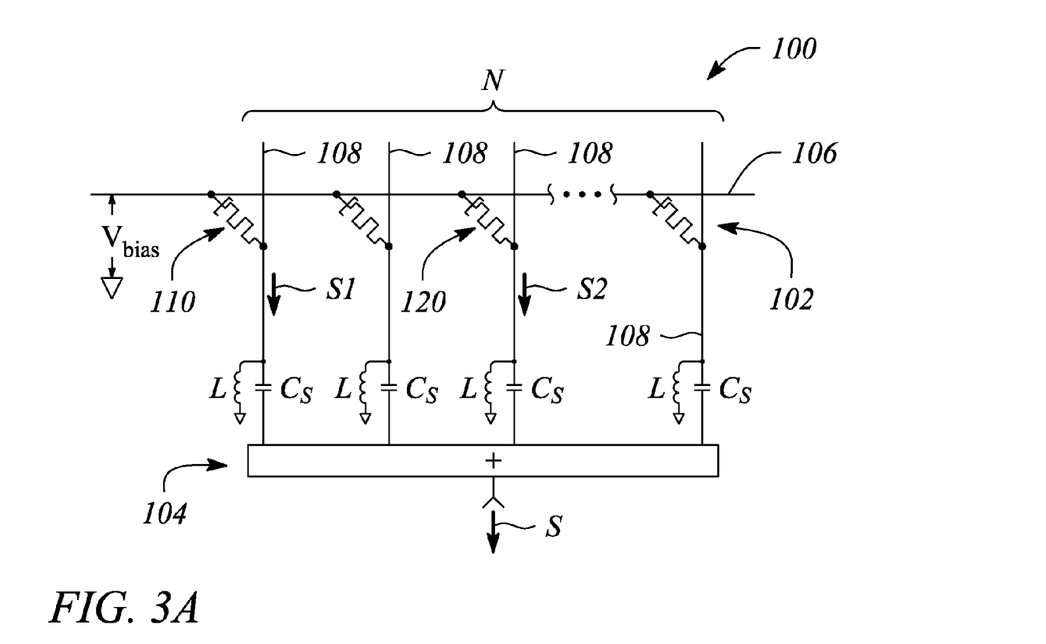
FIG. 3A illustrates a schematic of a memristive state programmable frequency source, according to an example.
Figure 3B:
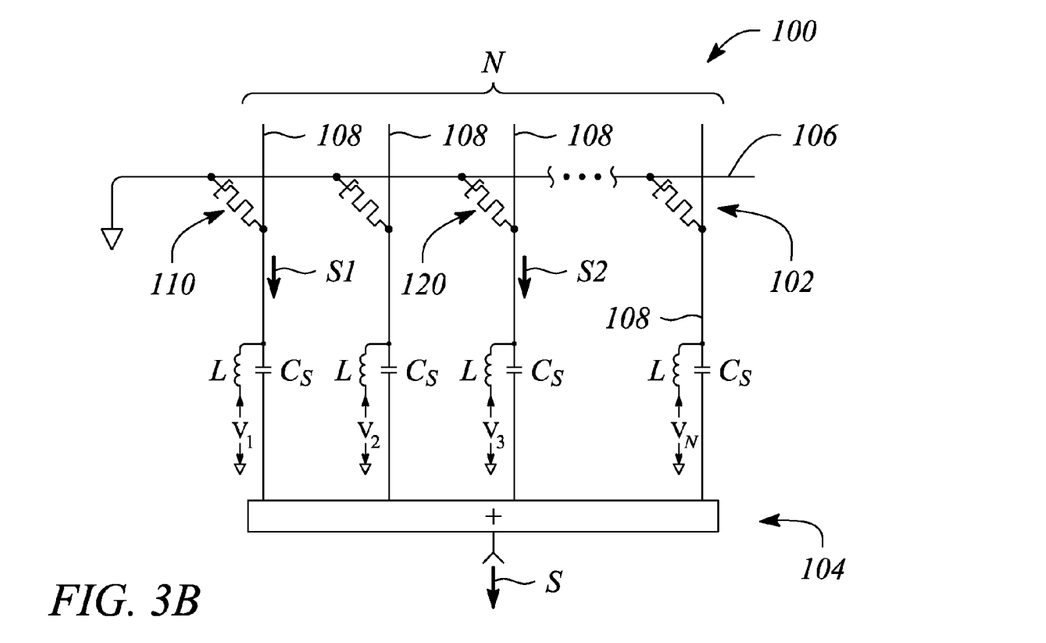
FIG. 3B illustrates a schematic of a memristive state programmable frequency source, according to another example.

FIG. 3A illustrates a schematic of a memristive state programmable frequency source 100, according to an example of the principles described herein. FIG. 3B illustrates a schematic of a memristive state programmable frequency source 100, according to another example of the principles described herein. The state programmable frequency source 100 illustrated in FIG. 3A and FIG. 3B may also be referred to as a memristive negative differential resistance (M-NDR) frequency source. The state programmable frequency source 100 comprises a plurality of memristive voltage controlled oscillators (VCOs) 102. The memristive VCOs 102 of the plurality are connected together to a common output 104 that sums (+) together signals produced by the memristive VCOs 102. Signals produced by selected memristive VCOs are provided as an output signal S at the common output 104 of the state programmable frequency source 100. The output signal S includes signals or 'frequencies' produced by the memristive VCOs 102 of the plurality according to programmable states of the various memristive VCOs 102 of the plurality, as is described in more detail below. In general, the plurality may include N memristive VCOs 102, where N is an integer greater than one.

As illustrated, the memristive VCOs 102 of the plurality are interconnected as a 1×N crossbar array, by way of example. Specifically, the N memristive VCOs 102 of the plurality are each connected to a common bus or 'crossbar' 106. For example, the crossbar 106 may provide either a bias voltage V as illustrated in FIG. 3A) or a ground connection as illustrated in FIG. 3B. When the crossbar 106 provides the bias voltage $V_{bias}$, output lines 108 may be used to provide a ground connection (e.g., through a plurality of inductive chokes L). A plurality of series capacitors $C_s$ may serve as a direct current (DC) block to isolate the bias voltage from circuitry of the common output 104.

Alternatively, when the crossbar 106 provides a ground connection as illustrated in FIG. 3B, the bias voltage or bias voltages (e.g., $V_1, V_2, V_3, \ldots V_N$) may be provided by way of the output lines 108, for example. In particular, inductive chokes L may be used to introduce the bias voltages $V_1, V_2, V_3, \ldots V_N$ as illustrated in FIG. 3B. Once again, series capacitors $C_s$ may serve as DC blocks. As illustrated in FIG. 3B, the bias voltages $V_1, V_2, V_3, \ldots V_N$ may either be equal to one another (e.g., $V_1=V_2=V_3=\ldots V_N$) or each bias voltage $V_k$ (k=1 . . . N) may be individually tailored to associated memristor VCOs 102.

In other examples (not illustrated), the memristive VCOs may be connected to a common output (e.g., common output 104) but individually connected to separate bias sources. In such a configuration, the common bus or crossbar may be absent. In other examples (not illustrated), the plurality of memristive VCOs may be organized in another crossbar array. For example, the memristive VCOs may be organized as an M×N crossbar array, where M is also an integer greater than one (e.g., as in FIG. 2).

As illustrated in the examples of FIG. 3A and FIG. 3B, the state programmable frequency source 100 comprises a first memristive negative differential resistance (M-NDR) VCO 110 of the plurality of memristive VCOs 102. The first M-NDR VCO 110 is configured to provide a first signal S1 having or being characterized by a first frequency. The state programmable frequency source 100 further comprises a second M-NDR VCO 120. The second M-NDR VCO 120 is configured to provide a second signal S2 having or being characterized by a second frequency.

In some examples, the first and second M-NDR VCOs 110, 120 may be independently programmed to be in either an 'active' state or an 'inactive' state. In other words, programming establishes independent programmable states of the first and second M-NDR VCOs 110, 120. Furthermore, programming is reversible in that the first and second M-NDR VCOs 110, 120 may be reprogrammed after having been previously programmed. When programmed in an active state, the first M-NDR VCO 110 provides the first signal S1 when biased with a bias voltage. Similarly, the second M-NDR VCO 120 provides the second signal S2 upon application of the bias voltage when programmed to be active. Programming that establishes an inactive state disables the individual first or second M-NDR VCO 110, 120 such that the respective first or second signal S1, S2 is not produced by application of the bias voltage.

Note that while reference is made herein to a 'bias voltage,' such reference is for convenience of discussion only and not by way of limitation. In some examples, bias may be provided by another bias source, bias type or bias signal (e.g., a bias current). Other biases other than a bias voltage are explicitly included in the discussion herein if such biases are applicable to a state programmable frequency source such as is described.

In some examples, the frequency of the first signal S1 is different from the frequency of the second signal S2. For example, a first signal frequency $f_1$ may be 1.0 GHz and the second signal frequency $f_2$ may be 2.0 GHz (i.e., $f_1 \neq f_2$). In another example, the first signal frequency $f_1$ may be 918 MHz and the second signal frequency $f_2$ may be 920 MHz. In other examples, the first signal frequency $f_1$ and the second signal frequency $f_2$ may be substantially similar. For example, the first signal frequency $f_1$ may equal the second signal frequency $f_2$ (i.e., $f_1 = f_2$). Further, whether or not the first and second signal frequencies are substantially similar, another one of the plurality of memristive VCOs 102 may produce another signal that has a frequency that differs from one or both of the first and second frequencies (i.e., $f_3 \neq f_2, f_1$). In some examples such as those listed above, the signals produced by the first and second M-NDR VCOs 110, 120 comprise microwave frequencies. In other examples, frequencies of the signals S1, S2 produced by the first and second M-NDR VCOs 110, 120 may comprise other than microwave frequencies.

In some examples, the first and second M-NDR VCOs 110, 120 independently comprise a memristive NDR device in parallel with a capacitance. A value of the capacitance may be predetermined or selected (e.g., during design) to independently establish the frequency of one or both of the first and second M-NDR VCOs 110, 120. In some examples, the capacitance may comprise a parasitic capacitance. For example, the capacitance may be due to the crossbar and a ground plane of the state programmable frequency source 100. Alternatively or even in addition, the parasitic capacitance may be a capacitance associated with an electrode connected to a terminal of the memristive NDR device. In other examples, a capacitive device (e.g., a capacitor) is connected in parallel with the memristive NDR device to provide the parallel capacitance. For example, the capacitance may be provided by a chip capacitor that is electrically connected to a circuit implementing the state programmable frequency source 100. In another example, a parallel plate or similar capacitor may be manufactured as part of the circuit that implements the state programmable frequency source 100. In yet other examples, the capacitance comprises both a parasitic capacitance and a capacitive device. In some examples, the memristive NDR device comprises a memristor that is cooled to cryogenic temperatures compatible with or that initiate an appearance of a negative differential resistance. In some examples, the memristive NDR device comprises a memristor that operates near room temperature to initiate an appearance of a NDR.

Figure 4A:
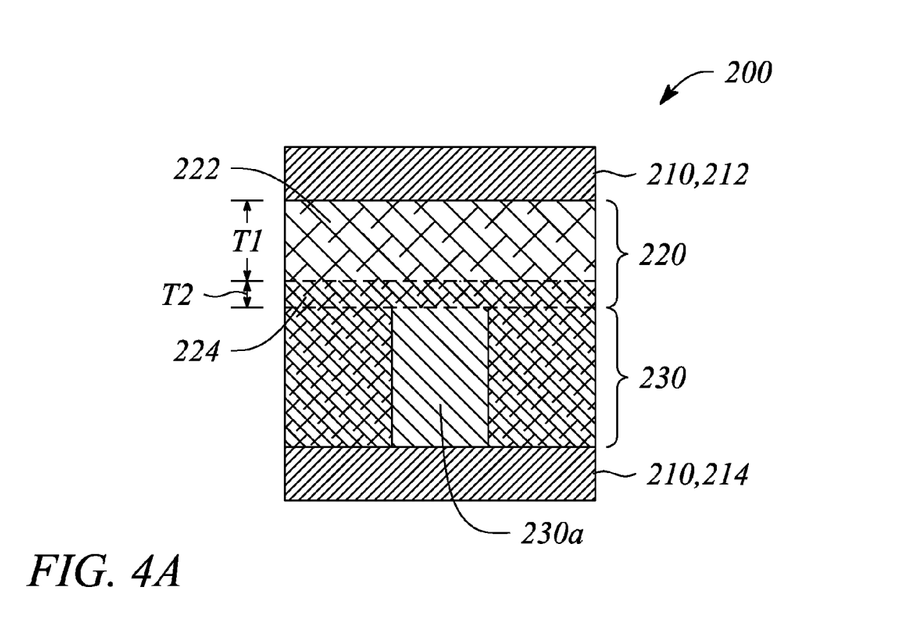
FIG. 4A illustrates a cross sectional view of a memristive negative differential resistance (M-NDR) device, according to an example.

FIG. 4A illustrates a cross sectional view of a memristive negative differential resistance (M-NDR) device 200, according to an example of the principles described herein. The illustrated memristive NDR device 200 may be the memristive NDR device of one or both of the first and second M-NDR VCOs 110, 120 of FIG. 3A or 3B, for example. As illustrated, the memristive NDR device 200 comprises a pair of electrodes 210. A first electrode 212 of the pair of electrodes 210 is illustrated above a second electrode 214 of the pair of electrodes 210, by way of example and not limitation. The first electrode 212 may be a crossbar connection of a crossbar array while the second electrode 214 may connect to an output (e.g., the common output 104), for example. The electrodes 212, 214 of the pair 210 comprise a conductive material such as a metal. For example, one or both of the first and second electrodes 212, 214 may comprise gold, silver, copper, aluminum or platinum.

The memristive NDR device 200 further comprises a memristor material or memristive matrix 220 adjacent and connected to the first electrode 212 of the pair 210. The memristive matrix 220 comprises a substantially undoped semiconducting region 222 having a first thickness T1 and a doped semiconducting region 224 having a second thickness T2. A memristive state of the memristive matrix 220 is established by a relative thickness of the first thickness T1 and the second thickness T2. In some examples, the memristive matrix 220 may comprise titanium dioxide ($TiO_2$). In such an example, a variable layer or portion of the $TiO_2$ may be oxygen deficient (e.g., may comprise $TiO_{2-x}$), for example. The second thickness T2 may represent a thickness of the oxygen deficient variable layer or portion, for example. The memristor matrix 220 generally comprises a thin film (e.g., less than about 200 nm thick), for example. The thin film may comprise material that is either nanocrystalline or amorphous to facilitate ionic transport, for example. Programming of the M-NDR device 200 is provided by ionic transport (e.g., oxygen transport) within the memristive matrix 220 that changes the relative thicknesses of the first and second thickness T1, T2 under the influence of a programming signal (e.g., a programming voltage). In some examples, the memristive matrix 220 may be substantially an intrinsic semiconductor immediately adjacent to the first electrode 212.

The memristive NDR device 200 further comprises a metal-insulator-transition (MIT) material 230. The MIT material 230 is located between the memristive matrix 220 and the second electrode 214 of the pair of electrodes 210. The MIT material 230 is connected to the second electrode 214 in series with the memristive matrix 220. By "in series" it is meant that an electrical path exists from the first electrode 212 to the second electrode 214 that passes first through the memristive matrix 220 and then through the MIT material 230. According to various examples, the MIT material 230 may comprise one or more of vanadium oxide, niobium oxide, iron oxide, manganese oxide and titanium oxide. For example, when the memristive matrix 220 comprises $TiO_2$, the MIT material 230 may comprise $Ti_4O_7$.

Figure 4B:
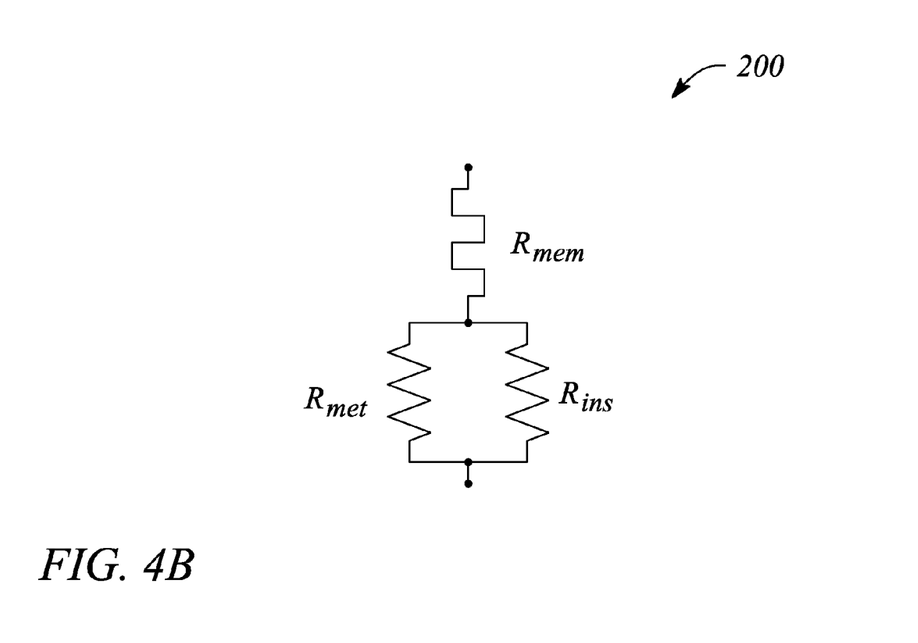
FIG. 4B illustrates a schematic diagram of a circuit model of the memristive negative differential resistance (M-NDR) device illustrated in FIG. 4A, according to an example.

FIG. 4B illustrates a schematic diagram of a circuit model of the memristive negative differential resistance (M-NDR) device 200 illustrated in FIG. 4A, according to an example of the principles described herein. In particular, as illustrated, the M-NDR device 200 is modeled as a memristance $R_{mem}$ connected in series with a parallel combination of resistances, $R_{met}$ and $R_{ins}$. The memristance $R_{mem}$ is a variable resistance associated with the programmed state of the memristance of the memristive NDR device 200. The memristance $R_{mem}$ is provided primarily by the memristive matrix 220. The parallel combination of resistances, $R_{met}$ and $R_{ins}$, represents a resistance of the MIT material 230 with a metal resistance $R_{met}$ being associated with a metal state of the MIT material 230 and an insulator resistance $R_{ins}$ being associated with an insulative state of the MIT material 230. The metal state may be provided by a metallic channel or filament that forms due to Joule heating in an otherwise substantially insulative matrix of the MIT material 230, for example. Such an example of a metallic channel 230a is illustrated in FIG. 4A.

Figure 5:
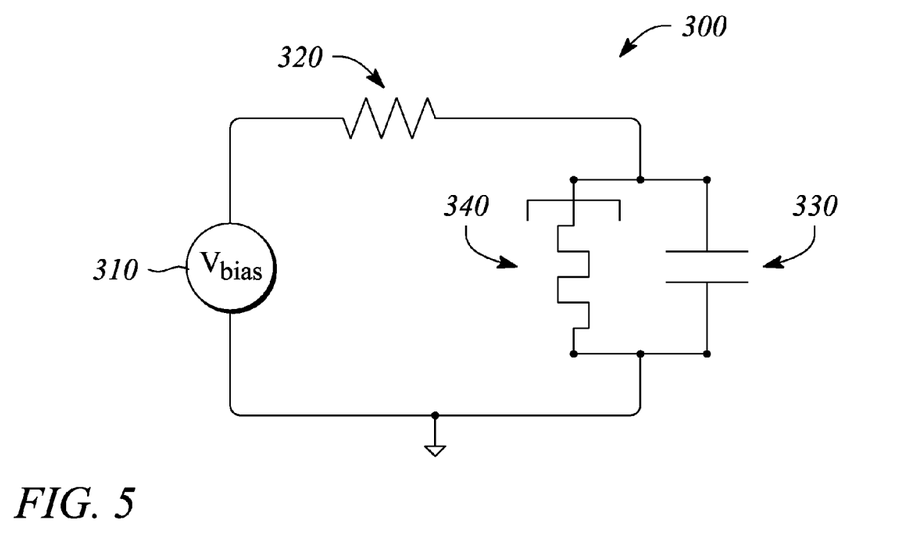
FIG. 5 illustrates a schematic diagram of a circuit model of a memristive negative differential resistance (M-NDR) voltage controlled oscillator (VCO), according to an example.

FIG. 5 illustrates a schematic diagram of a circuit model of a memristive negative differential resistance (M-NDR) voltage controlled oscillator (VCO) 300, according to an example of the principles described herein. As illustrated, the M-NDR VCO 300 comprises a bias voltage source 310, a series resistance 320, a capacitance 330 and an M-NDR device 340. The M-NDR device 340 and the capacitance 330 are connected in parallel between ground and a first terminal of the series resistance 320. The bias voltage source 310 is connected to a second terminal of the series resistance 320 to provide a bias voltage to the parallel combination of the M-NDR device 340 and capacitance 330. The M-NDR VCO 300 oscillates at a predetermined frequency when the bias voltage source 310 provides the bias voltage $V_{bias}$. A sequential charging and discharging of the capacitance 330 in association with the NDR of the M-NDR device 340 provides oscillation.

Referring again to FIG. 3A and FIG. 3B, the memristive state programmable frequency source 100 may be activated by applying a bias voltage. A value of the bias voltage is selected to correspond to an NDR region of the voltage-current relationship of the M-NDR devices. The NDR region is also referred to as the 'operating region' of the M-NDR devices that is readily determined from the devices themselves. The bias voltage may be provided by a bias voltage source that is substantially similar to the bias voltage source 310 illustrated in FIG. 5. In some examples, the bias voltage source may be attached to the M-NDR devices by a crossbar connection of a 1×N crossbar array, as illustrated.

Programming of the M-NDR devices may be provided by a programming voltage source (not illustrated). The programming voltage source provides a voltage that is above a threshold of the M-NDR devices for a sufficient time to affect programming thereof. Programming and characteristics of the programming voltage are consistent with programming a memristor in substantially any other memristor application. In particular, programming and the programming voltage source may be substantially similar to those for programming a memristor-based memory when the programmable states of the M-NDR VCOs are substantially 'ON' and 'OFF.'

Figure 6:
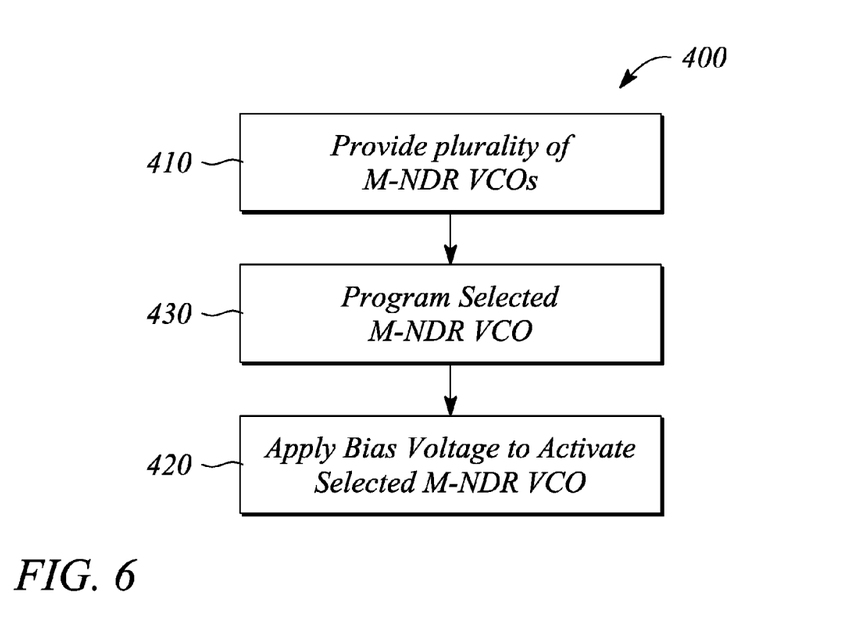
FIG. 6 illustrates a flow chart of a method of frequency generation having a programmable output frequency, according to an example.

FIG. 6 illustrates a flow chart of a method 400 of frequency generation having a programmable output frequency, according to an example of the principles described herein. The method 400 of frequency generation comprises providing 410 a plurality of memristive negative differential resistance (M-NDR) voltage controlled oscillators (VCOs). Each M-NDR VCO comprises an M-NDR device connected in parallel with a capacitance. The M-NDR VCOs may be substantially similar to the M-NDR VCOs 110, 120, described above with respect to the memristive state programmable frequency source 100, for example.

The method 400 of frequency generation further comprises applying 420 a bias voltage to activate a selected M-NDR VCO of the plurality to produce a frequency output. The applied 420 bias voltage may be provided by a bias voltage source as is described above. The selected M-NDR VCO is activated by the bias voltage according to a predetermined programming of the M-NDR device of the selected M-NDR VCO. In some examples, the predetermined programming is provided remotely with respect to a point of use of the method 400 of frequency generation. For example, the selected M-NDR VCO may be programmed by a manufacturer or supplier.

In some examples, the method 400 of frequency generation further comprises programming 430 the selected M-NDR VCO to establish the predetermined programming. According to some examples, programming 430 comprise applying a programming voltage to program the M-NDR device of the selected M-NDR VCO. In these examples, applying the programming voltage establishes a resistive state of the M-NDR device. The resistive state of the M-NDR device determines whether or not an M-NDR VCO is selectively activated by the applied bias voltage. Programming 430 may be performed after providing 410 a plurality of M-NDR VCOs but before applying 420 a bias voltage, according to some examples as illustrated in FIG. 6. For example, programming 430 may be performed on an array of M-NDR VCOs prior to using the array to perform the method 400 of frequency generation, wherein the array comprises a previously provided 410 plurality of M-NDR VCOs. In other examples (not illustrated), programming 430 may be performed prior to or as a part of providing 410. For example, a manufacturer that provides 410 the M-NDR VCOs may also perform programming 430 at the manufacturer's manufacturing facility. In yet other examples (not illustrated), programming 430 may be performed after applying 420 a bias voltage. For example, the array of M-NDR VCOs may be re-programmed at some time subsequent to commencing the method 400 of frequency generation. Re-programming may involve turning off the bias voltage and then applying the programming voltage, in some examples. The ability to perform programming 430 at virtually any time may greatly increase the versatility of the method 400 of frequency generation, for example.

Thus, there have been described examples of a frequency source and method of frequency generation that employ memristive negative differential resistance (M-NDR) voltage controlled oscillators (VCOs) to provide a programmable frequency signal. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A memristive state programmable frequency source comprising:
    a first memristive negative differential resistance (M-NDR) voltage controlled oscillator (VCO) of a plurality of memristive VCOs, the first M-NDR VCO to provide a first signal having a first signal frequency; and
    a second M-NDR VCO of the plurality of memristive VCOs, the second M-NDR VCO to provide a second signal having a second signal frequency, the first M-NDR VCO and the second M-NDR VCO being interconnected with the plurality of memristive VCOs,
    wherein the first M-NDR VCO and the second M-NDR VCO have independent programmable states and are connected to a common output of the state programmable frequency source.

2. The memristive state programmable frequency source of claim 1, wherein the first signal frequency is different from the second signal frequency.

3. The memristive state programmable frequency source of claim 1, wherein the plurality of memristive VCOs are interconnected in a 1×N crossbar array.

4. The memristive state programmable frequency source of claim 1, wherein the first M-NDR VCO and the second M-NDR VCO each comprises a memristive NDR device in parallel with a capacitance.

5. The memristive state programmable frequency source of claim 4, wherein the capacitance comprises a parasitic capacitance of an electrode connected to a terminal of the memristive NDR device.

6. The memristive state programmable frequency source of claim 4, wherein the memristive NDR device comprises:
a pair of electrodes;
a memristive matrix adjacent and connected to a first electrode of the pair of electrodes, the memristive matrix comprising an undoped semiconducting region having a first thickness and a doped region having a second thickness; and
a metal-insulator-transition (MIT) material between the memristive matrix and a second electrode of the pair of electrodes, the MIT material being connected to the second electrode in series with the memristive matrix.

7. The memristive state programmable frequency source of claim 6, wherein one or both of the first electrode and the second electrode comprise gold, silver, or platinum.

8. The memristive state programmable frequency source of claim 6, wherein the MIT material comprises one or more of vanadium oxide, niobium oxide, iron oxide, manganese oxide and titanium oxide.

9. The memristive state programmable frequency source of claim 1, further comprising a bias voltage source to provide a bias voltage within an NDR operating region of the first M-NDR VCO and the second M-NDR VCO.

10. The memristive state programmable frequency source of claim 1, further comprising a programming voltage source to program the programmable state of a selected one of the first M-NDR VCO and the second M-NDR VCO.

11. The memristive state programmable frequency source of claim 10, wherein the programmable state is selectable between an ON state and an OFF state according to a resistive state of the selected M-NDR VCO.

12. A memristive negative differential resistance (M-NDR) frequency source comprising:
a plurality of M-NDR devices, individual ones of the M-NDR devices comprising:
a first electrode;
a memristive matrix adjacent to and in electrical contact with the first electrode;
a second electrode; and
a metal-insulator transition (MIT) material sandwiched between and in mutual electrical contact with the memristive matrix and the second electrode; and
a plurality of capacitances, each M-NDR device having connected in parallel a different capacitance of the plurality of capacitances,
wherein a value of a respective capacitance of the plurality of capacitances is to determine an output frequency of the M-NDR device in parallel connection with the respective capacitance.

13. The memristive negative differential resistance (M-NDR) frequency source of claim 12, wherein the first electrodes of a quantity N of the M-NDR devices are connected to one another by a common crossbar conductor to form a 1×N crossbar array, where N is an integer greater than one.

14. The memristive negative differential resistance (M-NDR) frequency source of claim 12, wherein the MIT material comprises one or more of vanadium oxide, niobium oxide, iron oxide, manganese oxide and titanium oxide.

15. The memristive negative differential resistance (M-NDR) frequency source of claim 12, wherein the memristive matrix comprises titanium dioxide ($TiO_2$) and the MIT material comprises $Ti_4O_7$.

16. The memristive negative differential resistance (M-NDR) frequency source of claim 12, wherein the plurality of capacitances comprises capacitors connected to the first electrode and the second electrode of the individual M-NDR devices.

17. The memristive negative differential resistance (M-NDR) frequency source of claim 12, wherein the output frequency is a microwave frequency.

18. A method of frequency generation having a programmable output frequency, the method comprising:
providing a plurality of memristive negative differential resistance (M-NDR) voltage controlled oscillators (VCOs), each M-NDR VCO comprising an M-NDR device connected in parallel with a capacitance; and
applying a bias voltage to activate a selected M-NDR VCO of the plurality to produce a frequency output,
wherein the selected M-NDR VCO is activated by the bias voltage according to a predetermined programming of the selected M-NDR VCO.

19. The method of frequency generation of claim 18, further comprising programming the selected M-NDR VCO to establish the predetermined programming, wherein programming comprises applying a programming voltage to program the M-NDR device of the selected M-NDR VCO, and wherein applying the programming voltage establishes a resistive state of the M-NDR device, the resistive state determining whether or not an M-NDR VCO is selectively activated by the applied bias voltage.

20. The method of frequency generation of claim 18, wherein the M-NDR VCOs of the plurality are interconnected in a 1×N crossbar array, and wherein a metal-insulator-transition (MIT) material of the M-NDR device of each M-NDR VCO independently comprises one or more of vanadium oxide, niobium oxide, iron oxide, manganese oxide and titanium oxide.

* * * * *